United States Patent
Burgess et al.

(10) Patent No.: US 9,240,767 B2
(45) Date of Patent: Jan. 19, 2016

(54) TEMPERATURE-CONTROLLED INTEGRATED PIEZOELECTRIC RESONATOR APPARATUS

(75) Inventors: Byron Neville Burgess, Allen, TX (US); William Robert Krenik, Garland, TX (US); Stuart M. Jacobsen, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 504 days.

(21) Appl. No.: 13/484,961

(22) Filed: May 31, 2012

(65) Prior Publication Data
US 2013/0321101 A1 Dec. 5, 2013

(51) Int. Cl.
*H03H 9/02* (2006.01)
*H03H 9/17* (2006.01)

(52) U.S. Cl.
CPC ........... *H03H 9/02102* (2013.01); *H03H 9/175* (2013.01)

(58) Field of Classification Search
CPC ...... H01L 41/08; H03H 9/54; H03H 9/02102; H03H 9/175
USPC ......... 333/188, 193, 194, 195, 133, 186, 187; 310/335, 346; 29/25.35
See application file for complete search history.

(56) References Cited

U.S. PATENT DOCUMENTS

| | | | | |
|---|---|---|---|---|
| 6,060,692 A | * | 5/2000 | Bartley et al. | 219/210 |
| 6,131,256 A | * | 10/2000 | Dydyk et al. | 29/25.35 |
| 7,310,029 B2 | * | 12/2007 | Robert et al. | 333/188 |
| 7,408,428 B2 | | 8/2008 | Larson, III | |
| 7,463,118 B2 | | 12/2008 | Jacobsen | |
| 7,965,019 B2 | | 6/2011 | Gabl | |
| 2007/0285191 A1 | * | 12/2007 | Jacobsen | 333/187 |
| 2008/0055022 A1 | * | 3/2008 | Koehnke et al. | 333/193 |
| 2008/0298427 A1 | | 12/2008 | Gabl et al. | |
| 2008/0313900 A1 | * | 12/2008 | Kwon et al. | 29/890.1 |
| 2010/0134209 A1 | * | 6/2010 | Gabl | 333/187 |
| 2012/0096697 A1 | | 4/2012 | Grannen et al. | |

FOREIGN PATENT DOCUMENTS

JP 62-245811 * 10/1987
KR 10-0502569 B1 7/2005

* cited by examiner

*Primary Examiner* — Benny Lee
*Assistant Examiner* — Jorge Salazar, Jr.
(74) *Attorney, Agent, or Firm* — Jacqueline J. Garner; Frank D. Cimino

(57) ABSTRACT

An integrated resonator apparatus comprises a piezoelectric resonator, an acoustic Bragg reflector coupled to the piezoelectric resonator, and a substrate on which the acoustic Bragg reflector is disposed. The apparatus also includes an active heater layer covering the piezoelectric resonator. Heat produced by the active heater layer is controllable by an amount of current provided through the heater layer.

18 Claims, 4 Drawing Sheets

TEMPERATURE-CONTROLLED INTEGRATED PIEZOELECTRIC RESONATOR APPARATUS

CROSS-REFERENCE TO RELATED APPLICATION

None.

BACKGROUND

Timing solutions are important in modern electronics. Used in almost all commercial and consumer equipment, timing devices provide frequency control and timing for many applications. Crystal oscillators have been the predominant type of frequency generators for decades. Crystal oscillators typically use a piece of quartz which results in a fairly large device compared to the integrated circuits the crystal oscillator may be used to control. Further, temperature variations can effect the frequency of oscillation.

SUMMARY

The problems noted above are solved in large part by an integrated piezoelectric-based resonator that includes various aspects that provide for superior temperature-control.

For example, some embodiments are directed to an integrated resonator apparatus that comprises a piezoelectric resonator, an acoustic Bragg reflector coupled to the piezoelectric resonator, and a substrate on which the acoustic Bragg reflector is disposed. The apparatus also includes an active heater layer covering the piezoelectric resonator. Heat produced by the active heater layer is controllable by an amount of current provided through the heater layer.

Other embodiments are directed to a system that comprises an integrated resonator apparatus. The resonator apparatus includes a piezoelectric resonator, an acoustic Bragg reflector coupled to the piezoelectric resonator, and an active heater layer covering the piezoelectric resonator. The integrated resonator apparatus also includes a temperature sensor layer and a circuit that receives a temperature signal from the temperature sensor layer indicative of temperature and controls the amount of current to the active heater layer based on the temperature signal.

Yet other embodiments are directed to a method of forming a piezoelectric resonator with a Bragg reflector. The method includes depositing alternating dielectric layers of lower and higher acoustic impedance materials over a substrate and depositing a first resonator electrode over the alternating dielectric layers. The method further includes depositing a piezoelectric layer over the first resonator electrode, a second resonator electrode over the piezoelectric layer, and an active heater layer over the second resonator electrode.

Another embodiment is for a method that includes receiving a temperature signal from a temperature sensor layer in an integrated piezoelectric resonator. Further, based on the temperature signal, the method includes controlling an amount of heat generated by an active heater layer in the integrated piezoelectric resonator by adjusting electrical current through the active heater layer.

These and other embodiments are discussed below.

BRIEF DESCRIPTION OF THE DRAWINGS

For a detailed description of exemplary embodiments of the invention, reference will now be made to the accompanying drawings in which.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The term "about" means plus or minus 10%.

Figure 1:
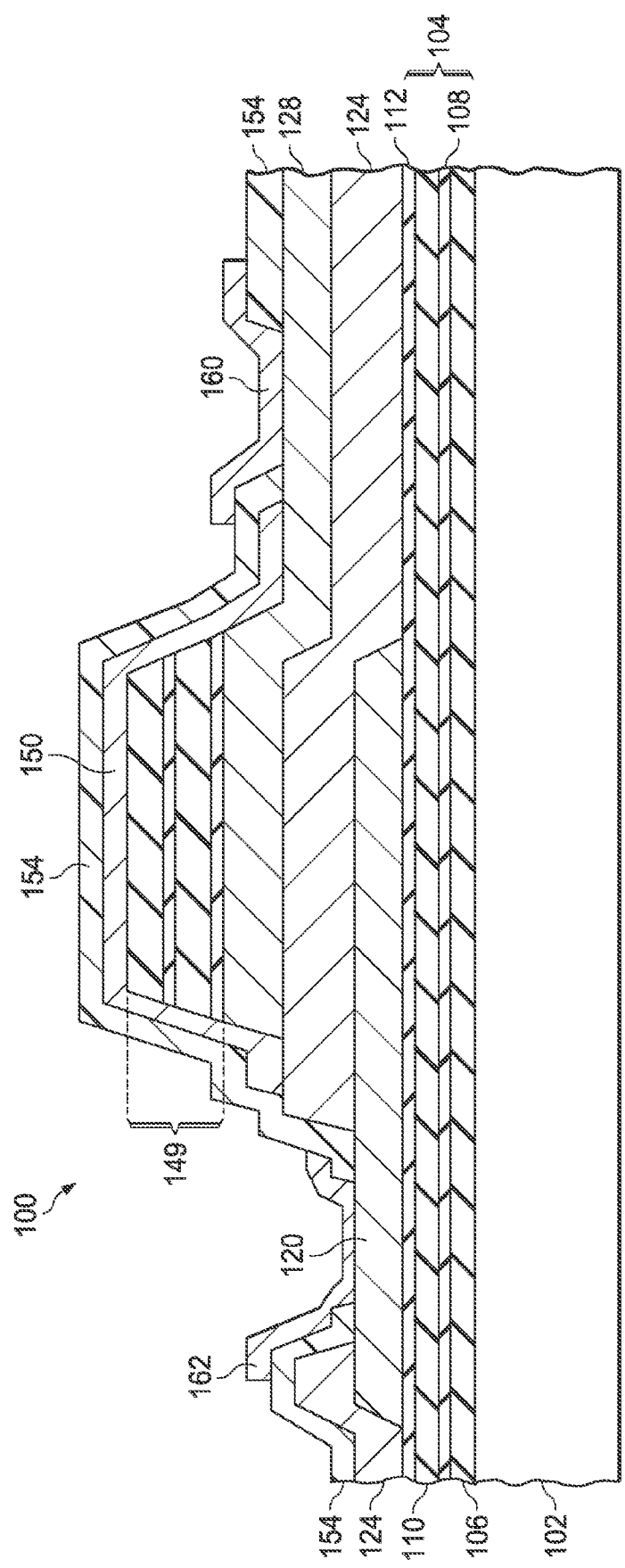
FIG. 1 shows a cross-section of a temperature-controlled integrated piezoelectric resonator in accordance with various embodiments of the invention.

FIG. 1 illustrates a cross-section of a temperature-controlled integrated piezoelectric resonator device 100 that includes a suitable substrate such as a single crystal silicon wafer 102. On the substrate, an acoustic reflector 104 (such as an acoustic Bragg reflector) preferably is formed. The acoustic Bragg reflector 104 may comprise alternating layers of higher acoustic impedance and lower acoustic impedance.

In the example of FIG. 1, a first layer 106 of high acoustic impedance material is deposited followed by a subsequent layer 108 of low acoustic impedance material. Additional layers 110 and 112 of high and low acoustic impedance material, respectively, are also deposited. Thus, layers 106 and 110 are high acoustic impedance material, and preferably the same material. Similarly, layers 108 and 112 are low acoustic impedance material, and preferably the same material.

In one example, the lower acoustic impedance material may be a dielectric such as nanoporous spin-on-glasses of nano-porous hydrogensilsesquioxane (HSQ) or nano-porous methyl silsesquioxane (MSQ) which may be deposited in a spin coater with a subsequent curing step.

The higher acoustic impedance material may be a dielectric such as comprise silicon carbide (SIC). If SiC is used as the higher impedance material, it may be deposited, in one example, in a plasma chemical vapor deposition (CVD) deposition chamber using source gases such as a mixture of methane ($CH_4$) and silane. If diamond-like-carbon (DLC) or Si-DLC is used, instead of SiC, then a modified deposition chamber is employed. DLC is deposited, for example, in a 150 mm parallel plate reactor RFCVD chamber with the upper plate being the gas distribution source and the lower plate being the cathode on which the substrate lies. In this configuration, the upper plate is positive and the cathode is negative (grounded). An RF source (e.g., 13.56 MHz) may be coupled directly to the substrate through the cathode. After the chamber is evacuated, any hydrocarbon gas, such as $CH_4$, and/or a Si containing hydrocarbon forming gas if Si-doping is required (e.g., tetramethyldisiloxane (4MS)), is introduced into the chamber until the desired pressure is achieved and flow is stable. Other gases such as argon (Ar) and hydrogen ($H_2$) can be used in addition to the hydrocarbon forming gases to control the chemical composition of the final DLC film. At this point power is delivered to the cathode to strike a plasma and DLC is deposited for a fixed amount of time until the desired thickness is achieved. Next the power is shut off and the chamber is vented using an inert gas (Ar, $N_2$, etc.) until ambient pressure is reached and the DLC deposited substrate is removed. Variables that affect DLC physical properties may include: RF power, pressure, total gas flow, different gas ratios and cathode to upper plate spacing. Prior to DLC deposition, an argon plasma may be used to pre-condition the substrate surface for the deposition for 1-2 minutes. DLC deposition may be done at ambient temperatures. DLC thickness and the index of refraction can be measured directly using, for example, a pre-calibrated ellipsometer.

In one example, the thickness of the individual layers of the acoustic Bragg reflector 104 is chosen to be equal to one-quarter wavelength of the resonant frequency of the device. Once the acoustic Bragg reflector 104 is complete the next step is to deposit the first resonator electrode 120. In one embodiment, the resonator electrode 120 is sputter deposited, and the material for the electrode is molybdenum (Mo), although other materials are possible as well such as titanium (Ti), tungsten (W), gold (Au), platinum (Pt) or aluminum (Al). In one example, the material for the resonator electrode may have a low thermoelastic loss and may have a thickness of less than about 1000 A in order to maintain a smooth surface.

After the first resonator electrode 120 has been deposited, a piezoelectric layer 124 is deposited. A suitable material for the piezoelectric layer 124 can be aluminum nitride (AlN) although other materials are possible as well such as zinc oxide (ZnO) and lead zirconate titanate (PZT). In one example the AlN layer is reactively sputter deposited with nitrogen gas using an optimized process yielding a low stress, dense layer with a c-axis orientation. The thickness of the piezoelectric layer 124 may be in the range from about 0.1 to about 10 microns.

Finally an upper electrode 128 is deposited to complete the resonator. Again the top electrode may be a sputter deposited layer of Mo. A top Bragg reflector 149 is also included and is the same or similar in construction to the lower Bragg reflector 104. Contact points 160 and 162 are provided for external connection to the device. Contact point 160 provides electrical contact to the upper electrode 128, and contact point 162 provides electrical contact to the lower electrode 128. The device 100 may have a protective overcoat 154 such as silicon nitride or silicon oxide.

Thus, the device 100 preferably comprises a substrate 102, an acoustic Bragg reflector 104, and a resonator (including electrodes 120 and 128 on opposing sides of piezoelectric layer 124).

The temperature-controlled aspects will now be described. In the embodiment of FIG. 1, an active heater layer 150 also is provided. The active heater layer 150 preferably comprises a tantalum aluminum alloy thin film, or other suitable material. The layer 150 may have a thickness of about 1000. At that thickness, the sheet resistance of the heater is about 30 ohms/square. The ratio of tantalum to aluminum in the heater layer may be about 50:50.

The active heater layer 150 is integrated into device 100 and is on top of and surrounds some, or all, of the upper electrode 128 and thus the resonator in general. An electrical current can be provided to the active heater layer 150 via contacts (not shown). The amount of heat produced by the active heater layer is controllable by the amount of current provided to the heater layer—higher current levels cause the heater layer 150 to generate higher levels of heat. Such a heater layer provides an overall oven controlled resonator structure that raises the temperature for the device 100 above the highest ambient temperature specification for the device. By forcing the temperature to a known and stable level, temperature variation is minimized or eliminated and thus temperature-induced variations in the device's frequency are avoided or at least reduced.

Figure 2:
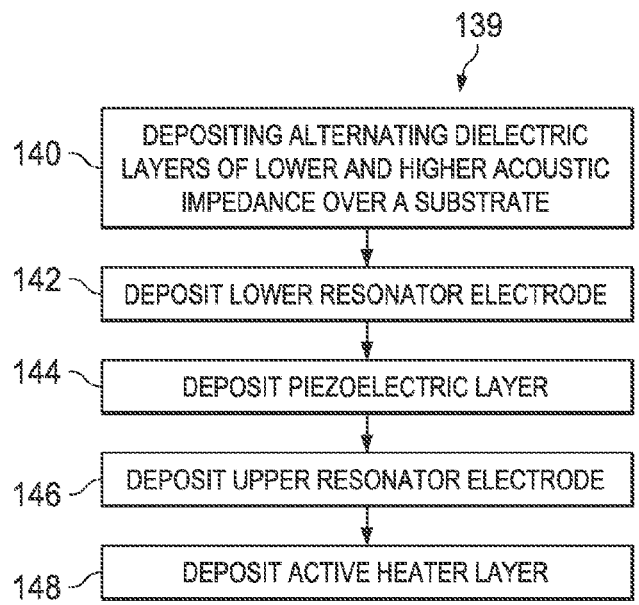
FIG. 2 shows a method of fabricating a temperature-controlled integrated piezoelectric resonator in accordance with various embodiments.

FIG. 2 illustrates a method 139 in accordance with various embodiments to make, for example, the temperature-controlled integrated piezoelectric resonator device 100 or other types of piezoelectric-based resonators with all dielectric Bragg reflectors. The steps of method 139 may be performed in the order shown or possibly in a different order. Further, two or more of the steps may be performed in parallel rather than serially.

At 140, the method comprises depositing alternating dielectric layers of lower and higher acoustic impedance over a substrate (e.g., substrate 102). The substrate may be formed out of silicon such as a single silicon wafer, GaAs, AlAs, and the like. The lower and higher acoustic impedance layers may be formed materials such as that described above.

After formation of the various layers of the Bragg reflector, at 142 the lower resonator electrode 120 is formed over the Bragg reflector. In one example, the material selected for the lower resonator electrode preferably has a low thermoelastic loss and preferably has a thickness of less than 1000 A in order to maintain a smooth resonator electrode surface. The upper electrode may be sputter deposited using materials such as molybdenum, titanium, tungsten, gold, platinum, aluminum, etc.

At 144, the piezoelectric layer is then deposited over the lower electrode. The piezoelectric layer may be formed from any suitable material such as aluminum nitride, zinc oxide, lead zirconate titanate, quartz, barium titanate, and the like. The aluminum nitride layer can be reactively sputter deposited with nitrogen gas using an optimized process yielding a low stress, dense layer employing a c-axis orientation.

An upper electrode is then deposited (146) as shown in FIG. 2. The upper electrode also can be a sputter deposited layer of Molybdenum. An upper Bragg reflector 149 (FIG. 1) may also be included.

Finally, the heater layer is deposited over the piezoelectric resonator as indicated at 148. The heater layer may comprise a tantalum aluminum alloy thin film and be formed by a semiconductor deposition/photo/dry etch process which would subsequently pattern the thin film.

Figure 3:
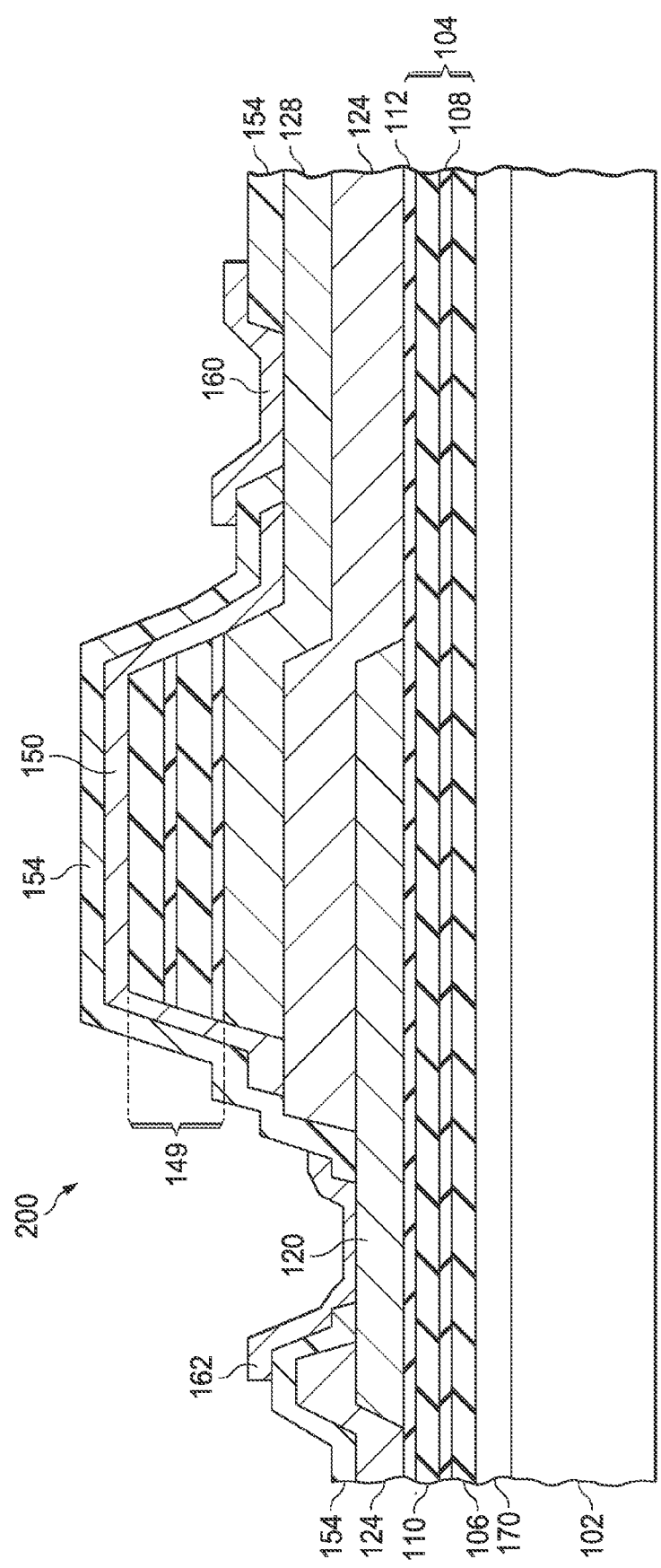
FIG. 3 shows a cross-section of another embodiment of a temperature-controlled integrated piezoelectric resonator.

Another temperature-controlled aspect is illustrated in FIG. 3. FIG. 3 shows another embodiment of a temperature-controlled integrated piezoelectric resonator device 200. The device 200 of FIG. 3 is similar in some respects to device 100 of FIG. 1. Device 200 also includes a substrate 102, an acoustic Bragg reflector 104 and a resonator comprising electrode 120, 128 and piezoelectric layer 124. The device 200 also includes the active heater layer 150.

Device 200 of FIG. 3 includes a temperature sensor layer 170 not shown in FIG. 1. Temperature sensor layer 170 is a temperature sense resistor and may be integrated between the acoustic Bragg reflector 104 and the substrate 102. The temperature sensor layer 170 may be fabricated doped polysilicon or other material having a relatively high temperature coefficient of resistance.

Figure 4:
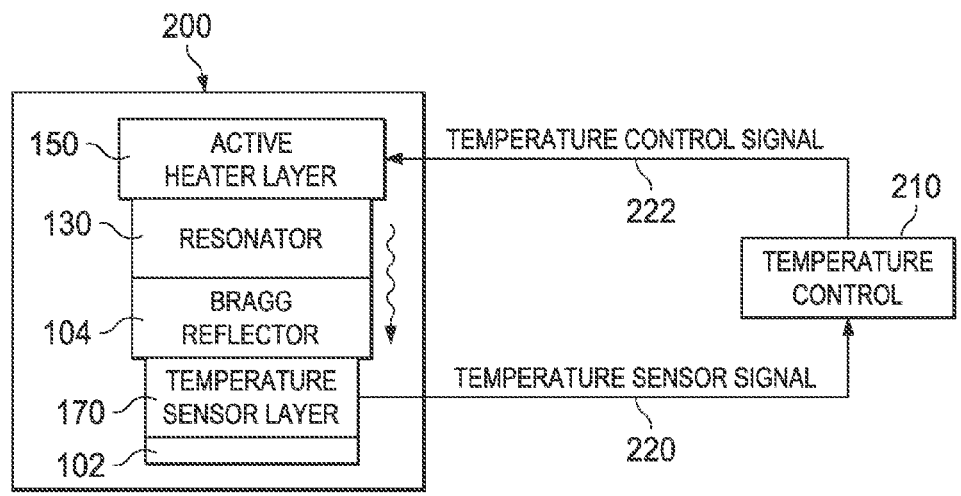
FIG. 4 shows a schematic of the use of the temperature-controlled integrated piezoelectric resonator of FIG. 2 with an external temperature control circuit.

As heat is created in the active heater layer 150, the heat is conducted through the resonator and acoustic Bragg reflector 104 to the temperature sensor layer 170. FIG. 4 schematically illustrates the temperature-controlled integrated piezoelectric resonator device 200 connected to an external temperature control circuit 210. The temperature control circuit 210 connects to the temperature sensor layer (TSL) 170 and to the active heater layer 150. A temperature sense signal 220 is provided from the TSL 170 to the temperature control circuit 210. The temperature control circuit 210 monitors the temperature sense signal 220 and determines if the temperature falls below a predetermined threshold. When the temperature falls below the predetermined threshold (indicative of a drop in temperature), the temperature control circuit 210 asserts the temperature control signal 222 to the active heater layer 150 to cause the heater layer to become warmer. In one embodiment, the temperature control signal 222 is an electric current whose amplitude can be controlled by the temperature control circuit 210. A higher current level causes a higher temperature to be produced by the active heater layer 150. Similarly, if the temperature of the TSL 170 exceeds the same or a higher threshold (a separate higher threshold may be preferred for hysteresis purposes), the temperature control circuit 210 determines that the temperature of the device 200 is becoming too warm and, in response, lowers the current amplitude of the temperature control signal 222. Thus, the combination of the TSL 170 and the active heater layer 150 provide for a highly controllable and stable temperature for device 200.

Figure 5:
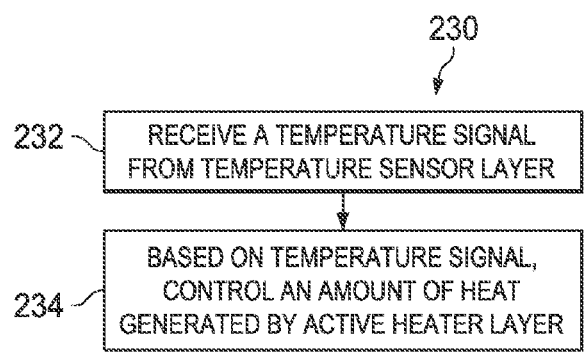
FIG. 5 shows a method of operating a temperature-controlled integrated piezoelectric resonator in accordance with various embodiments.

FIG. 5 illustrates a method 230 for controlling the temperature of the device 200. At 232, the temperature control circuit 210 receives a temperature signal from the temperature sensor layer 170. At 234, the temperature control circuit 210 controls the amount of heat generated by the active heater layer based on the received temperature signal. For example, the temperature control circuit 210 controls the amount of heat generated by the active heater layer in the integrated piezoelectric resonator device 200 by adjusting electrical current through the active heater layer.

Figure 6:
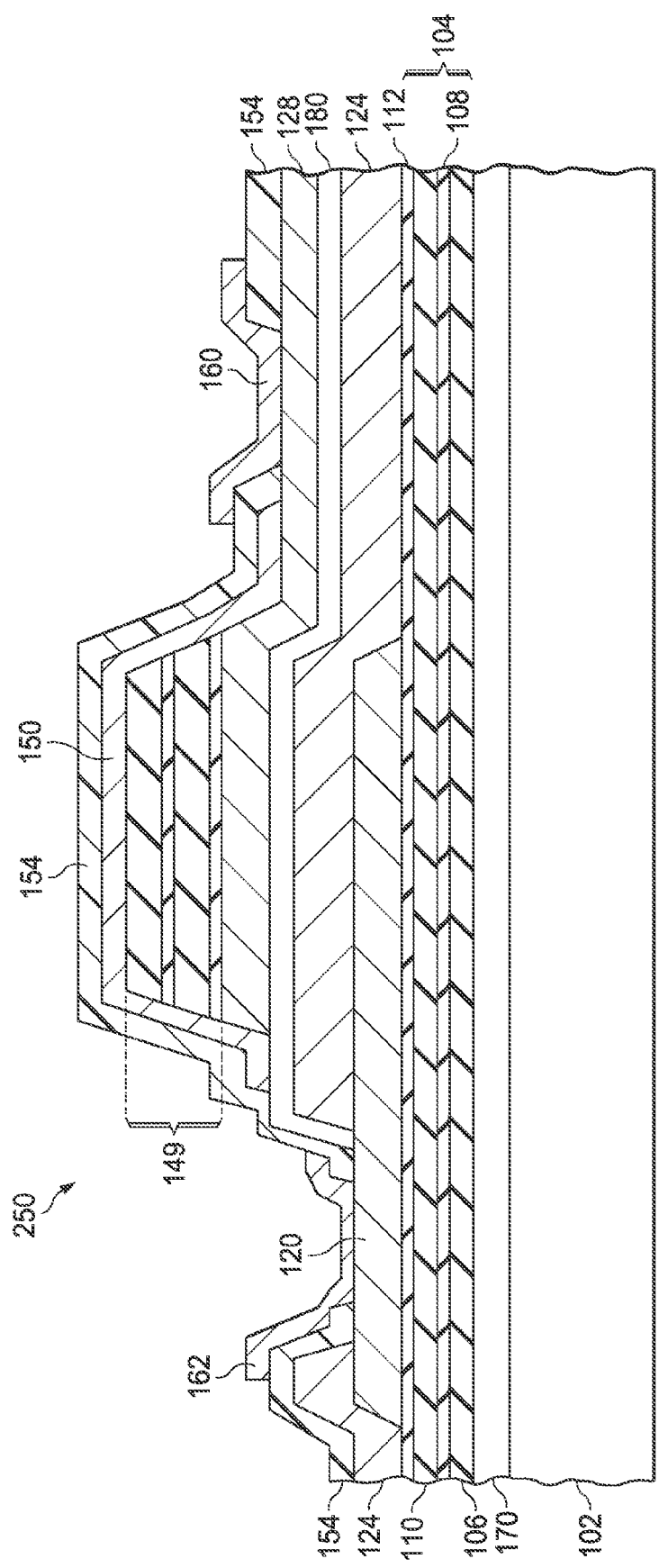
FIG. 6 shows a cross-section of yet another embodiment of a temperature-controlled integrated piezoelectric resonator.

FIG. 6 illustrates yet another embodiment of a temperature-controlled integrated piezoelectric resonator device 250 and another temperature control aspect. In some respects, the embodiment of FIG. 6 is similar to that of FIG. 3. FIG. 6 includes all of the components and layers shown in the embodiment of FIG. 3, but preferably includes an additional layer 180. Layer 180 comprises a temperature compensation layer. Temperature compensation layer 180 preferably is provided within the resonator between one of the electrodes 120, 128 (e.g., the upper electrode 128) and the piezoelectric layer 124.

The temperature compensation layer 180 compensates for the temperature coefficient of frequency of the rest of the device 250 (e.g., the piezoelectric layer 124). In a piezoelectric layer 124 made, for example, from aluminum nitride, the temperature coefficient of frequency may be about 20 ppm/° C. This means the frequency of the piezoelectric layer 124 increases by 20 ppm for each one degree rise in temperature. Some materials, such as AlN, have the property that they become stiffer at elevated temperatures. That being the case, such materials can be selected as the temperature compensation layer 180 to prevent, or at least reduce, the upward frequency trend with increasing temperature. One material suitable to function as the temperature compensation layer 180 is silicon dioxide. The temperature coefficient of frequency of the temperature compensation layer 180 preferably is of the same or similar magnitude (absolute value) as the temperature coefficient of frequency of the piezoelectric layer 124, but of the opposite sign. For example, if the temperature coefficient of frequency of the piezoelectric layer 124 is 20 ppm/° C., then the temperature coefficient of frequency of the temperature compensation layer 180 preferably is about −20 ppm/° C. In some embodiments, the thickness of the temperature compensation layer 180 may be in the range from about 10 nm to about 300 nm.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated resonator apparatus, comprising:
   a piezoelectric resonator;
   a first acoustic Bragg reflector coupled to the piezoelectric resonator;
   a substrate on which the first acoustic Bragg reflector is disposed;
   an active heater layer covering the piezoelectric resonator, heat produced by the active heater layer is controllable by an amount of current provided through the active heater layer; and
   a second acoustic Bragg reflector located between the active heater layer and the piezoelectric resonator.

2. The integrated resonator apparatus of claim 1 wherein the active heater layer comprises a tantalum aluminum alloy thin film.

3. The integrated resonator apparatus of claim 1 wherein the first acoustic Bragg reflector comprises alternating layers of higher acoustic impedance and lower acoustic impedance.

4. The integrated resonator apparatus of claim 3 wherein a thickness of each layer of higher and lower acoustic impedance is one quarter wavelength of a resonant frequency of the piezoelectric resonator.

5. The integrated resonator apparatus of claim 1 further comprising a temperature sensor layer between the first acoustic Bragg reflector and the substrate.

6. The integrated resonator apparatus of claim 5 wherein the temperature sensor layer comprises doped polysilicon.

7. The integrated resonator apparatus of claim 5 further comprising a temperature compensation layer that has a temperature coefficient of frequency that is about the same as a temperature coefficient of frequency of a piezoelectric layer of the piezoelectric resonator, but of an opposite sign.

8. The integrated resonator apparatus of claim 1 further comprising a temperature compensation layer that has a temperature coefficient of frequency that is about the same as a temperature coefficient of frequency of a piezoelectric layer of the piezoelectric resonator, but of an opposite sign.

9. The integrated resonator apparatus of claim 8 wherein the temperature compensation layer comprises aluminum nitride.

10. A system, comprising:
    an integrated resonator apparatus comprising a piezoelectric resonator, an acoustic Bragg reflector coupled to the piezoelectric resonator, an active heater layer covering the piezoelectric resonator;
    the integrated resonator apparatus also comprising a temperature sensor layer; and
    a circuit that receives a temperature signal from the temperature sensor layer indicative of temperature and controls an amount of current to the active heater layer based on the temperature signal.

11. The system of claim 10 wherein the piezoelectric resonator comprises a piezoelectric layer disposed between two electrodes, and the resonator apparatus further comprises a temperature compensation layer that has a temperature coefficient of frequency that is about the same as a temperature coefficient of frequency of the piezoelectric layer in the resonator, but of an opposite sign, wherein the temperature compensation layer is provided between one of the two electrodes and the piezoelectric layer.

12. The system of claim 11 wherein the temperature compensation layer comprises silicon dioxide.

13. The system of claim 10 wherein the active heater layer comprises a tantalum aluminum alloy thin film.

14. The system of claim 10 wherein the temperature sensor layer comprises doped polysilicon.

15. The system of claim 10 further comprising a temperature compensation layer that is disposed within the piezoelectric resonator.

16. A method, comprising: an integrated piezoelectric resonator with a temperature sensor layer that provides a temperature signal; and
receiving the temperature signal from the temperature sensor layer in the integrated piezoelectric resonator; and
based on the temperature signal, controlling an amount of heat generated by an active heater layer in the integrated piezoelectric resonator by adjusting electrical current through the active heater layer.

17. A method of forming a piezoelectric resonator with a Bragg reflector, comprising:
depositing alternating dielectric layers of lower and higher acoustic impedance materials over a substrate which defines the Bragg reflector;
depositing a first resonator electrode over the alternating dielectric layers;
depositing a piezoelectric layer over the first resonator electrode;
depositing a second resonator electrode over the piezoelectric layer;
depositing an active heater layer over the second resonator electrode; and
depositing a temperature sensor layer between the substrate and the alternating dielectric layers.

18. The method of claim 17 further comprising depositing a temperature compensation layer between the first resonator electrode and the second resonator electrode.

* * * * *